(12) United States Patent
Mizuno et al.

(10) Patent No.: US 9,252,070 B2
(45) Date of Patent: Feb. 2, 2016

(54) THREE-DIMENSIONAL MOUNTING SEMICONDUCTOR DEVICE AND METHOD OF MANUFACTURING THREE-DIMENSIONAL MOUNTING SEMICONDUCTOR DEVICE

(71) Applicant: FUJITSU LIMITED, Kawasaki-shi, Kanagawa (JP)

(72) Inventors: Yoshihiro Mizuno, Kobe (JP); Norinao Kouma, Atsugi (JP); Osamu Tsuboi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 33 days.

(21) Appl. No.: 14/041,073

(22) Filed: Sep. 30, 2013

(65) Prior Publication Data
US 2014/0027895 A1    Jan. 30, 2014

Related U.S. Application Data

(63) Continuation of application No. PCT/JP2011/058361, filed on Mar. 31, 2011.

(51) Int. Cl.
*H01L 23/46* (2006.01)
*H01L 23/473* (2006.01)
(Continued)

(52) U.S. Cl.
CPC ............. *H01L 23/46* (2013.01); *H01L 23/473* (2013.01); *H01L 25/0652* (2013.01);
(Continued)

(58) Field of Classification Search
CPC ... H01L 23/46; H01L 23/473; H01L 25/0652; H01L 25/0657; H01L 25/50
USPC .................................. 257/686, 685
See application file for complete search history.

(56) References Cited

U.S. PATENT DOCUMENTS 4,763,298 A    8/1988    Hoelzel et al.
5,016,138 A *  5/1991    Woodman ..................... 361/688
(Continued)

FOREIGN PATENT DOCUMENTS

EP    0566913    10/1993
EP    0706219    4/1996
(Continued)

OTHER PUBLICATIONS

English language International Search Report for PCT/JP2011/058361 mailed Jun. 28, 2011, 2 pages.
(Continued)

*Primary Examiner* — Matthew W Such
*Assistant Examiner* — Krista Soderholm
(74) *Attorney, Agent, or Firm* — Staas & Halsey LLP

(57) ABSTRACT

A three-dimensional mounting semiconductor device includes a layer structure including a plurality of first substrates with a trench-shaped concavity formed in and a plurality of second substrates with semiconductor elements formed in, which are alternately stacked, wherein an unevenness defined by a size difference between the first substrate and the second substrate is formed on a side surface, and a first through-hole are defined by an inside surface of the trench-shaped concavity and a surface of the second substrate, and a third substrate jointed to the side surface of the layer structure and having an unevenness formed on a surface jointed to the layer structure which are engaged with the unevenness formed on the side surface of the layer structure.

14 Claims, 18 Drawing Sheets

(51) Int. Cl.
*H01L 25/065* (2006.01)
*H01L 25/00* (2006.01)

(52) U.S. Cl.
CPC ............ *H01L 25/50* (2013.01); *H01L 25/0657* (2013.01); *H01L 2225/06551* (2013.01); *H01L 2225/06589* (2013.01); *H01L 2924/0002* (2013.01)

(56) References Cited

U.S. PATENT DOCUMENTS

| | | | |
|---|---|---|---|
| 5,067,233 A | 11/1991 | Solomon | |
| 5,309,318 A | 5/1994 | Beilstein, Jr. et al. | |
| 5,313,096 A * | 5/1994 | Eide | 257/686 |
| 5,506,753 A | 4/1996 | Bertin et al. | |

FOREIGN PATENT DOCUMENTS

| | | |
|---|---|---|
| JP | 63-187697 | 8/1988 |
| JP | 4-176151 | 6/1992 |
| JP | 5-251601 | 9/1993 |
| JP | 6-21291 | 1/1994 |
| JP | 7-218174 | 8/1995 |
| JP | 8-111502 | 4/1996 |
| JP | 2002-81874 | 3/2002 |
| JP | 2005-228919 | 8/2005 |

OTHER PUBLICATIONS

Extended European Search Report dated Sep. 2, 2014 in corresponding European Patent Application No. 11862688.6.
Japanese Office Action issued Aug. 12, 2014 in corresponding Japanese Patent Application No. 2013-507021.

* cited by examiner

THREE-DIMENSIONAL MOUNTING SEMICONDUCTOR DEVICE AND METHOD OF MANUFACTURING THREE-DIMENSIONAL MOUNTING SEMICONDUCTOR DEVICE

CROSS-REFERENCE TO RELATED APPLICATION

This application is a continuation application of International Application PCT/JP2011/058361 filed on Mar. 31, 2011 and designated the U.S., the entire contents of which are incorporated herein by reference.

FIELD

The embodiments discussed herein are related to a three-dimensional mounting semiconductor device including a plurality of semiconductor chips stacked and a method of manufacturing the same.

BACKGROUND

Semiconductor IC chips and the packages, electronic parts, such as car-mounted power semiconductor devices, and electronic apparatuses, etc. are required to mount functions that effectively radiate the heat generated in the operation and are capable of continuously operating with high reliability. In servers and PCs, for example, CPU (Central Processing Units), which generate very much heat are used, and it is required to effectively radiate the heat generated from them to properly maintain the temperature environments inside the casings and installation sites. As the devices are more downsized and are more speeded up, the current density increases, which lead to more heat generation, and it is increasingly required to effectively radiate the heat.

Especially in a three-dimensional mounting semiconductor device having a plurality of semiconductor chips stacked, it is difficult to cool all the semiconductor chips in the stacked layers by a heat radiation device, such as a heat sink or others, provided on the chip surfaces. It is important how to effectively radiate the heat from the inside semiconductor chips.

In such background, as a proposed technique of effectively cooling the respective semiconductor chips of a three-dimensional mounting semiconductor device is noted a cooling technique using a microchannel. This technique is of providing a plurality of microchannels in a three-dimensional mounting semiconductor device and flowing a liquid for cooling in the microchannels to thereby cool the respective semiconductor chips.

The microchannel is a channel of dimensions of the micro-order for flowing a liquid. The flow of the micro-scale is a laminar flow and also generates the effect that the surface force (viscosity effect of liquid) is more influential than the body force, whereby the thermal conductivity can be improved with a low flow rate of the fluid. Thus, the heat generated from heat source can be effectively moved while required cooling efficiency can be provided. Furthermore, a merit is that the width and the height of the channel of the micro-order allows the cooling device to be downsized. Another merit is that a small use quantity of the fluid allows the degree of freedom of the design to be improved for the move area and the storage area of the fluid.

The followings are examples of related: Japanese Laid-open Patent Publication No. 05-251601; and Japanese Laid-open Patent Publication No. 06-21291.

To flow a fluid for the cooling through the microchannels provided in the three-dimensional mounting semiconductor device, it is important to ensure the joints among the plural semiconductor chips and with other members endurably to the pressure of the fluid. Especially, in the operation of the semiconductor device, often thermal expansion takes place due to heating, and the reliability of the joints is required to be improved.

SUMMARY

According to one aspect of the embodiments, there is provided a three-dimensional mounting semiconductor device including a layer structure including a plurality of first substrates with a trench-shaped concavity formed in and a plurality of second substrates with semiconductor elements formed in, which are alternately stacked, wherein an unevenness defined by a size difference between the first substrate and the second substrate is formed on a side surface, and a first through-hole is defined by an inside surface of the trench-shaped concavity and a surface of the second substrate, and a third substrate jointed to the side surface of the layer structure and having an unevenness formed on a surface jointed to the layer structure which are engaged with the unevenness formed on the side surface of the layer structure.

According to another aspect of the embodiments, there is provided a method of manufacturing a three-dimensional mounting semiconductor device including alternately stacking a plurality of first substrates with a trench-shaped concavity formed in and a plurality of second substrates with semiconductor elements formed in to form a layer structure having a first through-hole defined by an inside surface of the trench-shaped concavity and a surface of the second substrate and an unevenness defined by a size difference between the first substrate and the second substrate formed on a side surface, and jointing a third substrate having an unevenness which are engaged with the unevenness formed on the side surface of the layer structure, to the side surface of the layer structure.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 7A and 7B are cross-sectional views illustrating the structure of the three-dimensional mounting semiconductor device according to the first embodiment having pipes connected to;

DESCRIPTION OF EMBODIMENTS

[A First Invention]

A three-dimensional mounting semiconductor device according to a first embodiment will be described with reference to FIGS. 1 to 11B.

Figure 1:
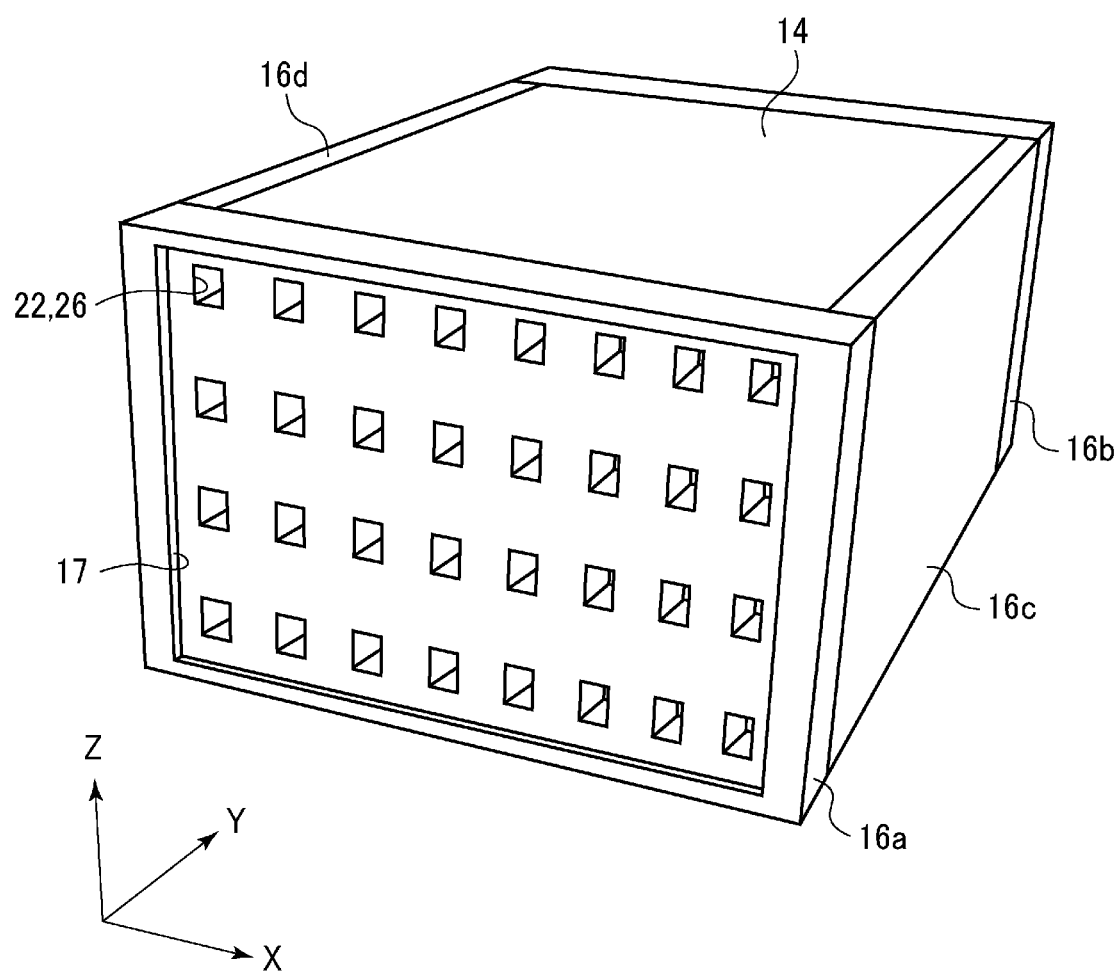
FIG. 1 is a perspective view illustrating a structure of a three-dimensional mounting semiconductor device according to a first embodiment.
Figure 2:
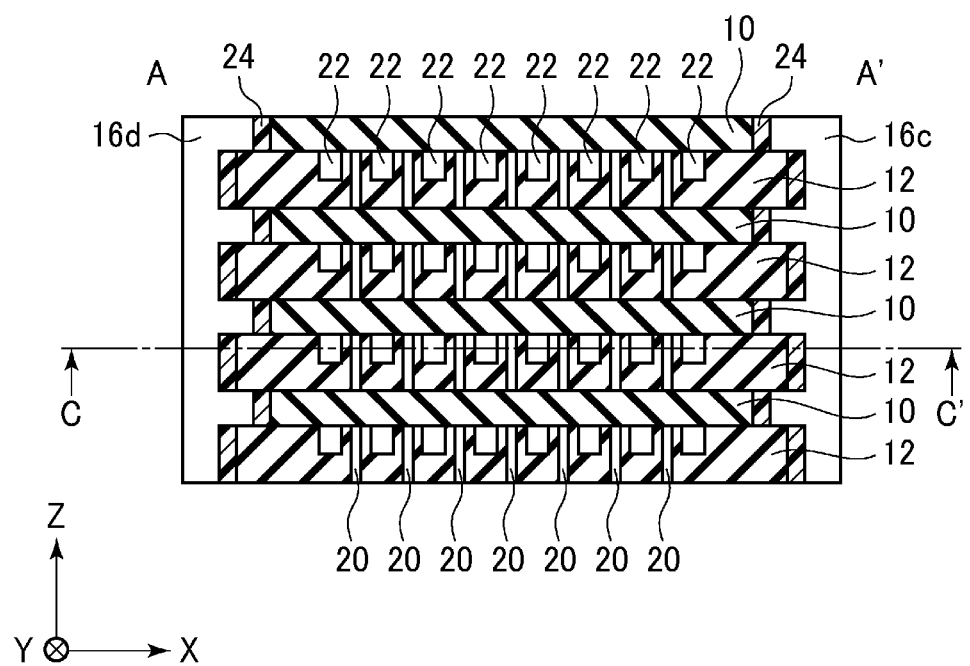
FIGS. 2, 3 and 4 are cross-sectional views illustrating the structure of the three-dimensional mounting semiconductor device according to the first embodiment.
Figure 3:
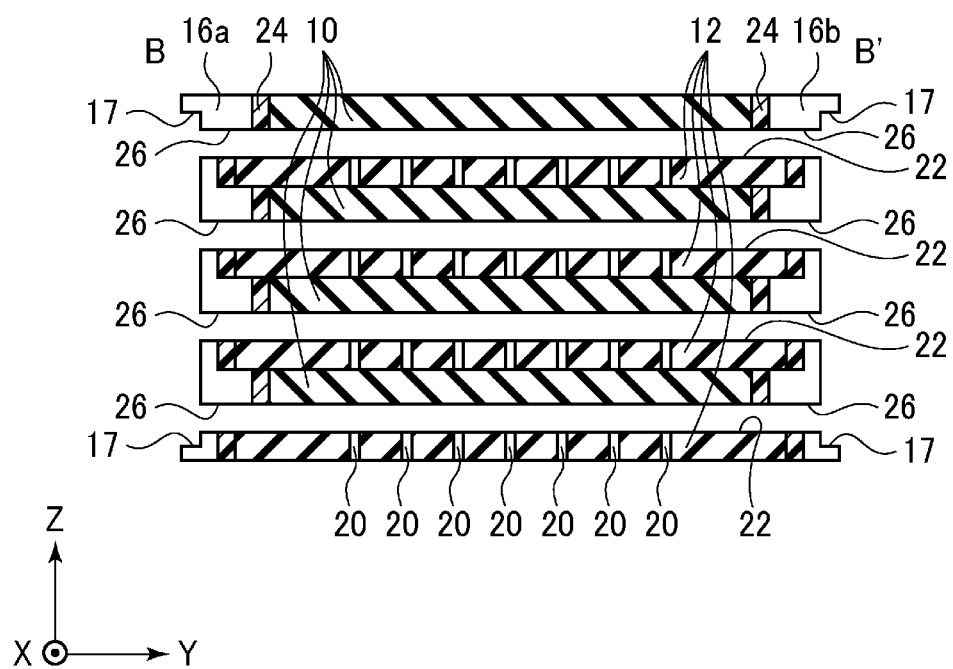
Figure 4:
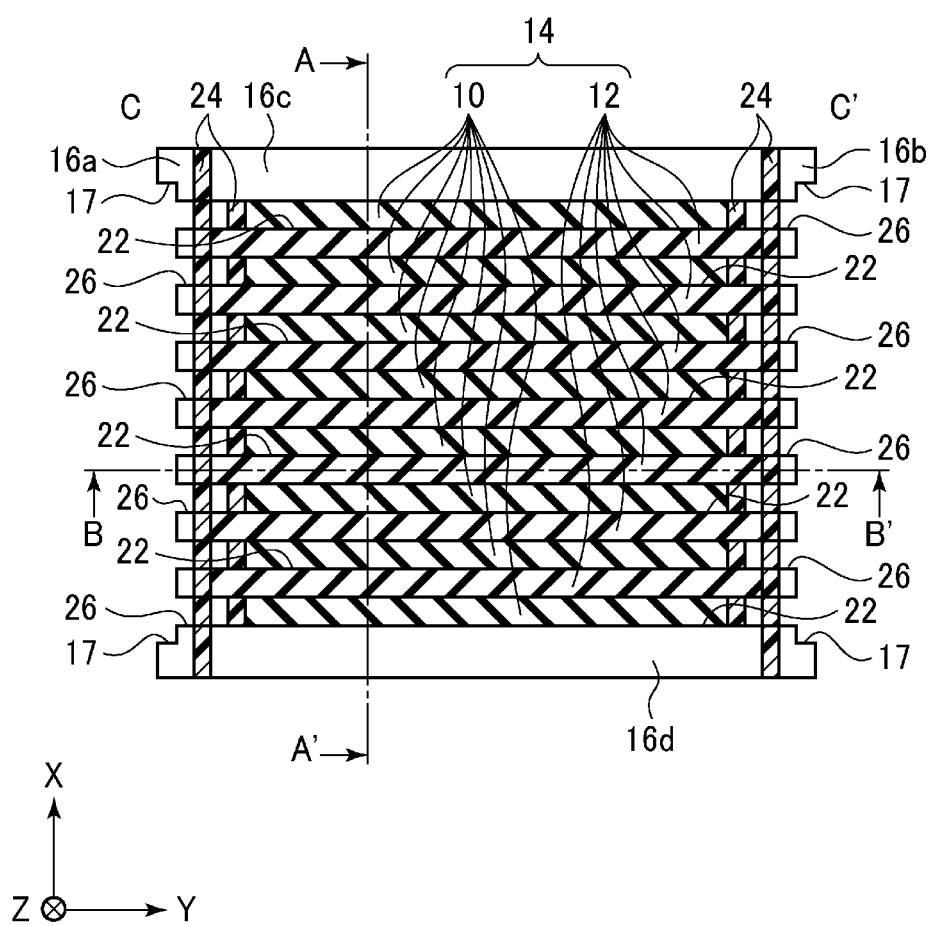
Figure 5A:
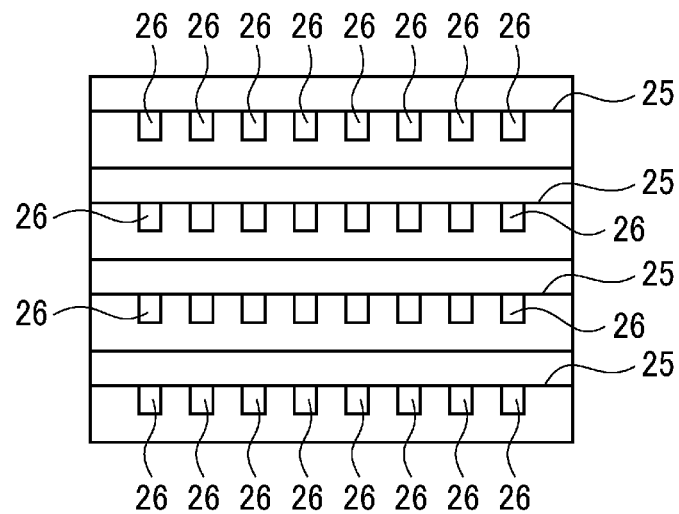
FIGS. 5A, 5B and 6 are plan views illustrating structures of silicon chips used in the three-dimensional mounting semiconductor device according to the first embodiment.
Figure 6:
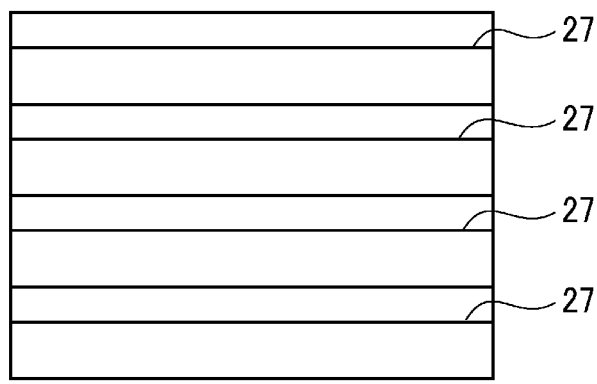
Figure 7A:
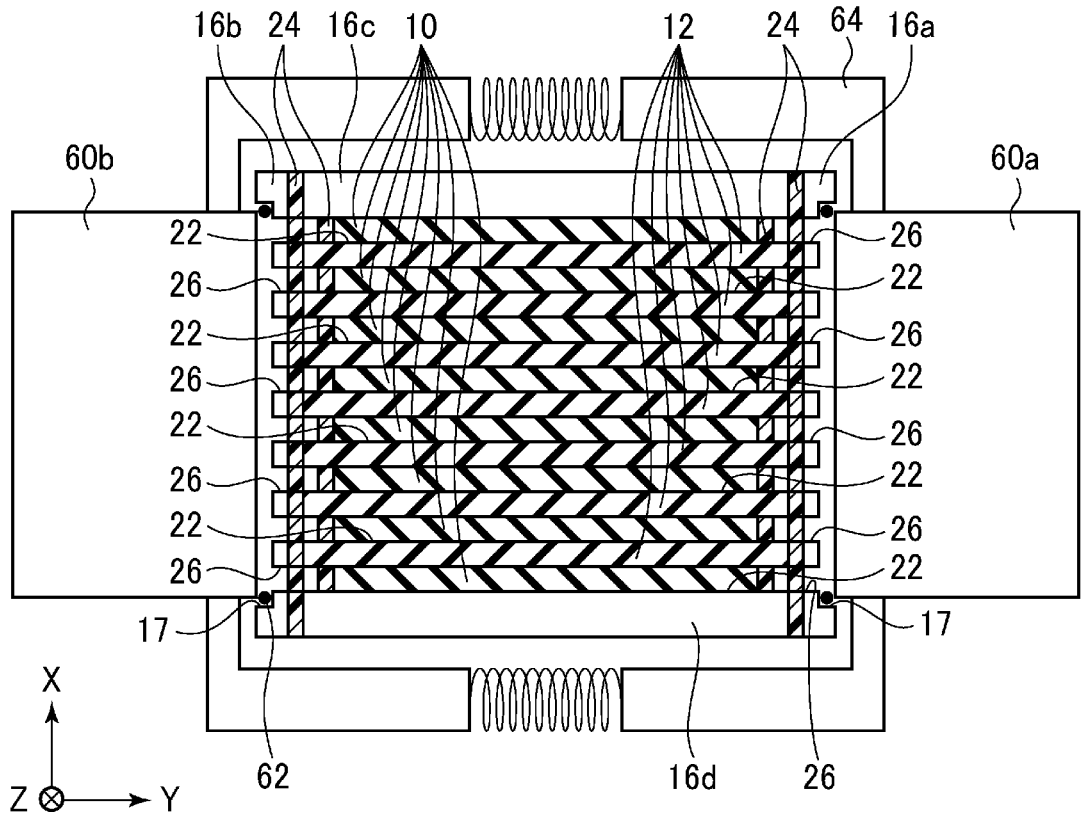
Figure 7B:
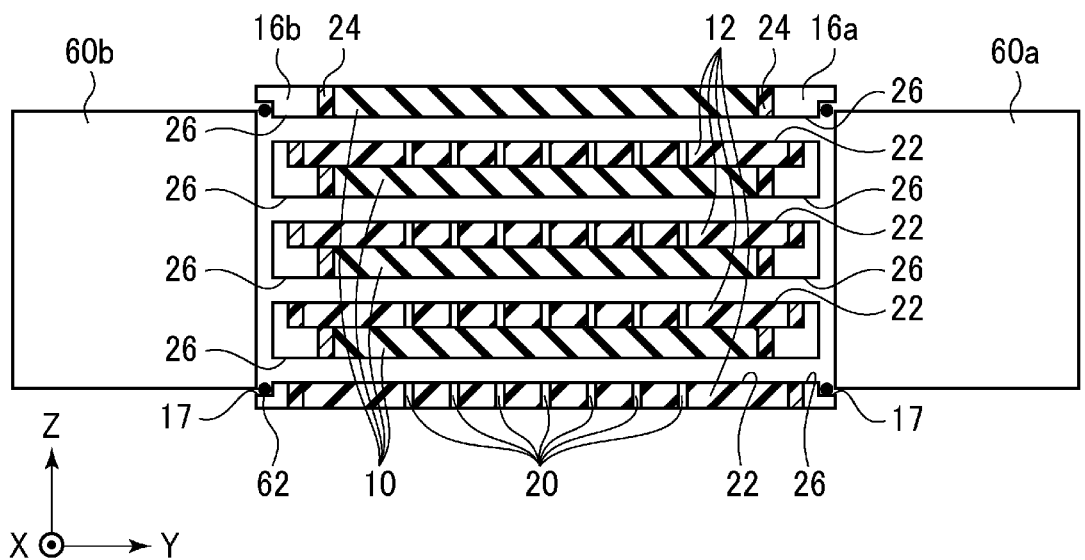

FIG. 1 is a perspective view illustrating a structure of the three-dimensional mounting semiconductor device according to the present embodiment. FIGS. 2-4 are cross-sectional views illustrating the structure of the three-dimensional mounting semiconductor device according to the present embodiment. FIGS. 5A-6 are plan views illustrating a structure of silicon chips used in the three-dimensional mounting semiconductor device according to the present embodiment. FIGS. 7A and 7B are cross-sectional views illustrating the structure of the three-dimensional mounting semiconductor device according to the present embodiment having pipes connected to. FIGS. 8A-11B are cross-sectional views illustrating a method of manufacturing the three-dimensional mounting semiconductor device according to the present embodiment.

First, the structure of the three-dimensional mounting semiconductor device according to the present embodiment will be described with reference to FIGS. 1 to 6. FIG. 2 is the cross-sectional view along a plane parallel to the X-Z plane of FIG. 1 and corresponds to the A-A' line cross-sectional view of FIG. 4. FIG. 3 is the cross-sectional view along a plane parallel to the Y-Z plane and corresponds to the B-B' line cross-sectional view of FIG. 4. FIG. 4 is the cross-sectional view along a plane parallel to the X-Y plane of FIG. 1 and corresponds to the C-C' line cross-sectional view of FIG. 2.

As illustrated in FIG. 1, the three-dimensional mounting semiconductor device according to the present embodiment includes a layer structure 14, and silicon chips 16a, 16b, 16c, 16d jointed to the respective side surfaces of the layer structure 14. The three-dimensional mounting semiconductor device according to the present embodiment includes a plurality of microchannels 22, 26 passed through between the side surface of the layer structure with the silicon chip 16a jointed to and the side surface of the layer structure with the silicon chip 16b jointed to.

As illustrated in FIGS. 2 and 3, the layer structure 14 is formed of semiconductor chips 10 and microchannel chips 12 alternately stacked. In the example of FIGS. 2 and 3, four semiconductor chips 10 and four microchannel chips 12 are alternately stacked, but the numbers of the semiconductor chips 10 and the microchannel chips 12 are not essentially four.

Each semiconductor chip 10 has a semiconductor element having a prescribed function and formed on a silicon substrate, and, as required, have through-hole interconnections not illustrated.

Each microchannel chip 12 is a plate formed of silicon, and has through-hole interconnection 20 formed through in the Z direction and trenches (microchannels 22) extended in the Y direction.

The trenches formed in the microchannel chips 12 are covered by the semiconductor chips 10 by stacking the semiconductor chips 10 and the microchannel chips 12. Thus, the plurality of microchannels 22 formed through the layer structure 14 in the Y direction are formed between the semiconductor chips 10 and the microchannel chips 12.

The microchannels 22 are channels (grooves) for flowing a cooling fluid, such as water or others. The cooling fluid is flowed through the microchannels 22, whereby the semiconductor chips 10 heated by operations can be cooled. The microchannels 22 has a size of, e.g., a 70 μm-width and a 100 μm-height.

Between the upper semiconductor chip 10 and the lower semiconductor chip 10 sandwiching each microchannel chip 12, required interconnections are formed by the through-hole interconnections 20 formed in the microchannel chips 12.

The X-directional size and the Y-directional size of each microchannel chip 12 are larger than the X-directional size and the Y-directional size of each semiconductor chip 10. The Z-directional size (thickness) of the semiconductor chip 10 and the Z-directional size (thickness) of the micro-chip 12 are not specifically limited. The Z-directional size (thickness) of the semiconductor chip 10 is selected suitably from, e.g., about 50 μm-1000 μm in accordance with, e.g., the X-directional size and the Y-directional size of the semiconductor chip 10, and the process of forming the semiconductor chip 10. The Z-directional size (thickness) of the microchannel chip 12 is suitably selected from about 50 μm-1000 μm in accordance with, e.g., the X-directional size and the Y-directional size of the microchannel chip 12, and the process of forming the microchannel chip 12.

The sizes of the semiconductor chip 10 are not specifically limited, but for example, the X-directional size is 10000 μm, the Y-directional size is 10000 μm, and the z-directional size (thickness) is 500 μm. The sizes of the microchannel chip 12 are not specifically limited, but for example, the X-directional size is 10200 μm, the Y-directional size is 10200 μm, and the Z-directional size (thickness) is 200 μm.

The X-directional size and the Y-directional size of the semiconductor chip 10, and the X-directional size and the Y-directional size of the microchannel chip 12 may be different from each other. The X-directional size and the Y-directional size of the microchannel chip 12 may be smaller than the X-directional size and the Y-directional size of the semiconductor chip 10. One of the X-directional size and the Y-directional size of the semiconductor chip 10 may be larger, and the other of the X-directional size and the Y-directional size of the microchannel chip 12 may be larger.

By alternately stacking the semiconductor chips 10 and the microchannel chips 12, which have different sizes, steps corresponding to a difference of the sizes between the semiconductor chips 10 and the microchannel chips 12 are formed on the respective sides of the layer structure 14 (refer to FIGS. 2 and 3).

Preferably, the semiconductor chips 10 and the microchannel chips 12 are formed of materials having the same thermal expansion coefficient. In the case that the thermal expansion coefficient of the material forming the semiconductor chips 10 and the thermal expansion coefficient of the material forming the microchannel chips 12 are different, there is a risk that cracks may formed between the semiconductor chips 10 and the microchannel chips 10 due to the heat generated in driving the semiconductor chips 10. In the case described above, the semiconductor chips 10 and the microchannel chips 12 are formed of the same material, silicon, but may be formed of different materials as long as the materials have thermal expansion coefficients approximate to each other.

As illustrated in FIGS. 1 to 4, the silicon chips 16a, 16b, 16c, 16d are jointed respectively to the four side surfaces of the layer structure 14. The silicon chip 16a and the silicon chip 16b are formed respectively on the two side surfaces of the layer structure 14, which intersects the Y direction, and the silicon chips 16c and the silicon chip 16d are formed respectively on the side surfaces of the layer structure 14, which intersects the X direction.

Figure 5B:
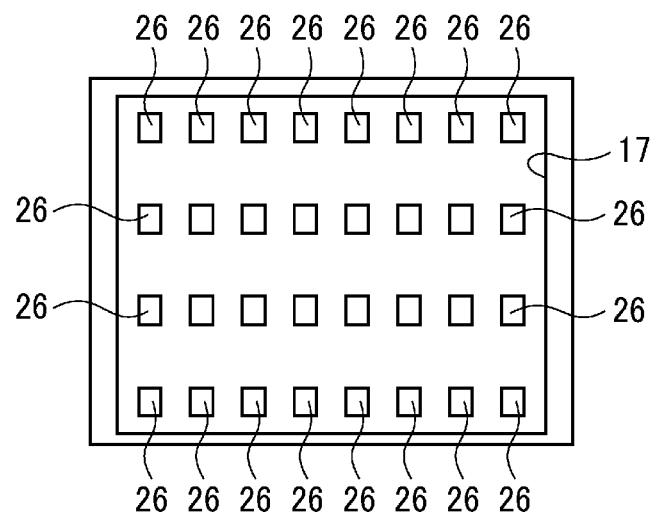

The silicon chip 16a has the structure illustrated in FIGS. 5A and 5B.

As illustrated in FIG. 5A, in the surface of the silicon chip 16a, which is jointed to the layer structure 14, unevenness 25 and through-holes 26 are formed. The unevenness 25 have the configuration engaged with the steps on the side surface of the layer structure 14. The through-holes 26 have the same size as the microchannels 22 and are formed in alignment with the positions of the microchannels 22 exposed on the side surface of the layer structure 14.

As illustrated in FIG. 5B, in the surface of the silicon chip 16a, which is opposite to the surface jointed to the layer structure 14, a concavity 17 and through-holes 26 are formed. The concavity 17 is provided to facilitate the connection to the pipes (not illustrated) for inletting the cooling fluid to the microchannels 22. The size of the concavity 17 is not specifically limited, but the size in the Y direction is, e.g., 500 µm, and the size in the Z direction is, e.g., 2800 µm.

The rest surfaces of the silicon chips 16a are plane, but this is not essential.

The silicon chip 16b has the same configuration as the silicon chip 16a.

As illustrated in FIG. 6, the silicon chip 16c has unevenness 27 engaged with the steps on the side surface of the layer structure 14 formed on the surface jointed to the layer structure 14.

The silicon chip 16d has the same configuration as the silicon chip 16c.

As illustrated in FIGS. 2 to 4, the silicon chips 16a, 16b, 16c, 16d are jointed to the respective side surfaces of the layer structure 14 with silicone rubber layers 24 formed therebetween. The thickness of the silicone rubber layers 24 is not specifically defined but is, e.g., about 10 µm.

It is preferable that the silicon chips 16a, 16b, 16c, 16d are formed of a material having the same thermal expansion coefficient as the material forming the layer structure 14. This is because, in the case that the thermal expansion coefficient of the material forming the silicon chips 16a, 16b, 16c, 16d is different from the thermal expansion coefficient of the material forming the layer structure 14, there is a risk that cracks may be formed between the layer structure 14 and the silicon chips 16a, 16b, 16c, 16d due to the heat generated in driving the semiconductor chip 10. In the example described here, the silicon chips 16a, 16b, 16c, 16d are formed of silicon, which is the same material as the material of the layer structure 14, but the same material may not be essentially used as long as the materials have thermal expansion coefficients approximate to each other.

Next, one example of the method of connecting the pipes for flowing the cooling fluid to the three-dimensional mounting semiconductor device according to the present embodiment will be described with reference to FIGS. 7A and 7B. FIG. 7A is the cross-sectional view parallel to the X-Y plane, and FIG. 7B is the cross-sectional view parallel to the Y-Z plane.

As illustrated in FIGS. 7A and 7B, the pipes for flowing the cooing fluid are connected respectively to the surfaces of the three-dimensional mounting semiconductor device on the side of the silicon chip 16a and on the side of the silicon chip 16b. That is, the pipe 60a is connected to the surface on the side of the silicon chip 16a. The pipe 60b is connected to the surface on the side of the silicon chip 16b.

The pipes 60a, 60b are jointed to the cavities 17 of the silicon chips 16a, 16b with micro-O-rings 62 placed therebetween. The concavities 17 formed in the silicon chips 16a, 16b facilitates the alignment of the three-dimensional mounting semiconductor device with the pipes 60a, 60b and the fixation of the pipes 16a, 16b. Preferably, the diameter of the pipes 60a, 60b is suitably selected corresponding to the dimensions of the openings of the concavities 17. Otherwise, preferably the size of the concavities 17 of the silicon chips 16a, 16b suitably selected corresponding to the diameter of the pipes 60a, 60b. The configuration of the concavities 17 is may not be essentially rectangular and can be suitably selected corresponding to the configuration of the pipes 60a, 60b.

Preferably, the pipes 60a, 60b are connected by, e.g., a fastener 64 having a spring function. The three-dimensional mounting semiconductor device is sandwiched between the pipes 60a, 60b connected by the fastener 64, whereby the joint of the pipe 60a and the silicon chip 16a and the joint of the pipe 60b and the silicon chip 16b can be ensured. Thus, the disalignment between the pipes 60a, 60b, the leakage of the cooling fluid, etc. can be prevented.

Next, the method of manufacturing the three-dimensional mounting semiconductor device according to the present embodiment will be described with reference to FIGS. 8A to 11B.

First, the semiconductor chips 10 and the microchannel chips 12 for forming the layer structure 14 are prepared.

The X-directional size and the Y-directional size of each microchannel chip 12 are set at sizes different from the X-directional size and the Y-directional size of each semiconductor chip 10. For example, the X-directional size of the semiconductor chip 10 is 10000 µm, the Y directional size thereof is 10000 µm, and the Z directional size (thickness) thereof is 500 µm. The X-directional size of the microchannel chip 12 is 10200 µm, the Y-directional size thereof is 10200 µm, and the Z-directional size (thickness) thereof is 200 µm.

Next, the semiconductor chips 10 and the microchannel chips 12 prepared are alternately stacked, and the layer structure 14 is formed.

The method of forming the layer structure 14 is not specifically limited but can be formed by, e.g., surface activation jointing process can be used. The surface activation jointing process applies ion beam to surfaces to be jointed to activate the surfaces, align the interconnections, and joints the surfaces under pressure.

Other than the surface activation jointing process, oxide film direct jointing process which makes hydrophilic the silicon of the surfaces to be jointed or the surface of silicon oxide film and joints the surfaces with hydroxyls may be used. Otherwise, metal jointing process which forms thin films, such as Cu film, Al film or others, on the surfaces to be jointed and joints the surfaces by using the diffusion of the metal atoms may be used. Otherwise, other jointing processes, such as resinous jointing process which joints the surfaces with BCB (Benzocyclobutene) or others, etc.) may be used. In the case that the metal jointing process is used, the metal thin films are so patterned in advance that the metal thin films may not influence the electric conduction between the through-lines.

Independent of the layer structure 14, the silicon chips 16a, 16b, 16c, 16d are manufactured.

The silicon chips 16a, 16b, 16c, 16d are manufactured as exemplified below.

First, a silicon substrate 40, for example, is prepared as the substrate for the silicon chips 16a, 16b to be formed. The thickness of the silicon substrate is not specifically limited but is about 200 μm-525 μm, e.g., 500 μm. In the present embodiment, patterns, such as photoresists or others, are formed on the upper surface and the lower surface of the substrate, and etching is made, and for this, as the substrate, the silicon substrate 40 preferably has both surfaces mirror-polished. The silicon substrate 40 may be made conductive by doping an impurity.

Then, silicon oxide films 42a, 42b are formed above the upper surface and the lower surface of the silicon substrate 40 by, e.g., plasma CVD method. The film thickness of the silicon oxide films 42a, 42b is, e.g., about 1 μm-2 μm.

Figure 8A:
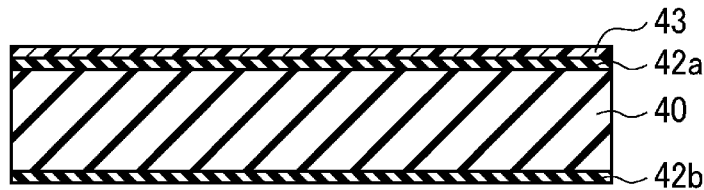
FIGS. 8A-8D, 9A-9E, 10A-10D and 11A-11B are cross-sectional views illustrating a method of manufacturing the three-dimensional mounting semiconductor device according to the first embodiment.

Then, a photoresist film 43 is formed above the silicon oxide film 42a by, e.g., spin coating method. The film thickness of the photoresist film 43 is, e.g., about 4 μm. The photoresist film 43 is, e.g., a photoresist from AZ Electronic Materials Limited (trade name: AZ P4620). The photoresist film is coated above the silicon oxide film 42a at, e.g., a rotation speed of 2000 rpm. Then, the photoresist film is subjected to a heat treatment of 120° C. Thus, the photoresist film 43 is formed above the silicon oxide film 42a (FIG. 8A).

Next, the photoresist film 43 is patterned by photolithography to form openings 44 in the regions of the photoresist film 42 for the through-holes 26 to be formed in. The opening dimensions of the openings 44 is, e.g., about 70 μm×100 μm.

Figure 8B:
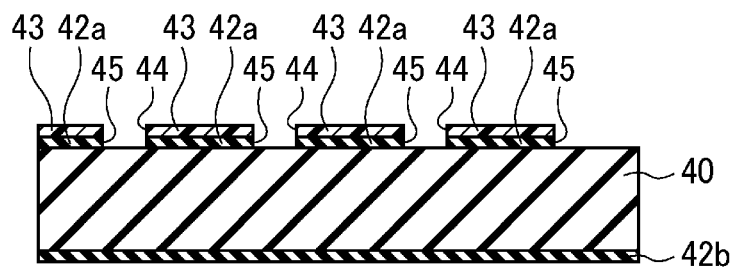

Next, with the photoresist film 43 as the mask, the silicon oxide film 42a is etched by wet etching with, e.g., buffered hydrofluoric acid. Thus, openings 45 are formed in the regions for the through-holes 26 of the silicon oxide film 42a (FIG. 8B).

The etching period of time is suitably adjusted corresponding to the film thickness of the silicon oxide film 42a. When the silicon oxide film 42a is etched, the lower surface of the silicon substrate 40 is covered by a protection film, such as photoresist film or others, so that the silicon oxide film 42b on the lower surface may not be etched.

Next, the photoresist film 43 is removed by, e.g., ashing method or others.

Figure 8C:
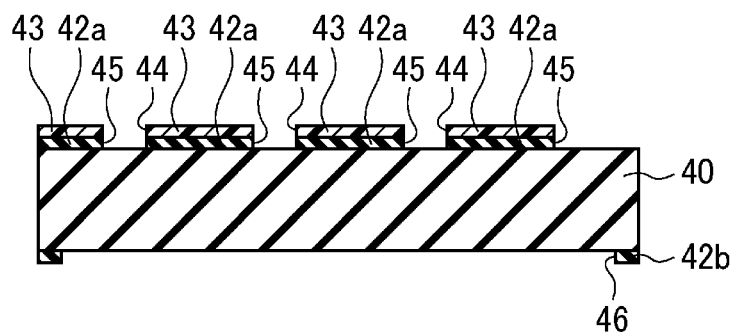

Next, by the same procedure, the silicon oxide film 42b formed on the lower surface of the silicon substrate 40 is patterned to form openings 46 in the regions of the silicon oxide film 42b for the concavity to be formed in. The opening dimensions of the openings 46 is, e.g., 10000 μm×200 μm (FIG. 8C).

Next, a photoresist film 48 is formed above the silicon oxide film 42a by, e.g., spin coating method. The film thickness of the photoresist film 48 is, e.g., about 4 μm.

Figure 8D:
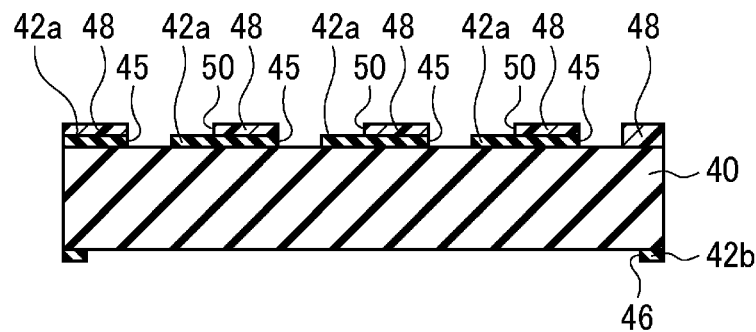

Then, the photoresist film 48 is patterned by photolithography. Thus, the openings 50 corresponding to the convexities of the unevenness 25 are formed in the photoresist film 48 (FIG. 8D). The opening dimensions of the openings 50 are, e.g., about 10200 μm×200 μm.

Figure 9A:
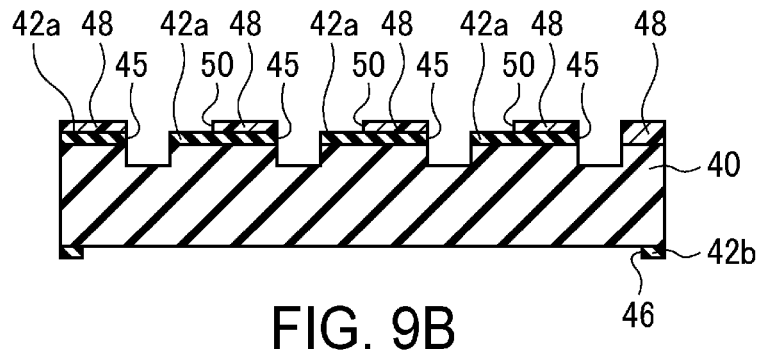

Next, with the silicon oxide film 42a and the photoresist film 48 as the mask, the silicon substrate 40 is etched by, e.g., about 300 μm by, e.g., DRIE (Deep Reactive Ion Etching) method (FIG. 9A).

DRIE method is an etching technique wherein the etching and the side wall protection are repeated. In the step of the etching, the etching is made with, e.g., $SF_6$ gas. In the side wall protection step, the side wall is protected with, e.g., $C_4F_8$ gas. The protection film suppresses the transverse etching, and the etching becomes anisotropic. Thus, the trenches can be formed in a high aspect ratio.

In the first step of the DRIE method, the processing of introducing $C_4F_8$ gas at the flow rate of, e.g., 130 sccm under the conditions, e.g., of the coil power of 600 W and the internal pressure of the process chamber of 14.5 mTorr can be applied for 6.3 seconds. In the second step of the DRIE method, the processing of introducing $SF_6$ gas at the flow rate of 130 sccm under the conditions, e.g., of the coil power of 600 W, the internal pressure of the processing chamber of 14.5 mTorr and the RF power to the substrate of 23 W of 380 kHz can be applied for 7.5 seconds. The first step and the second are alternately repeated.

Figure 9B:
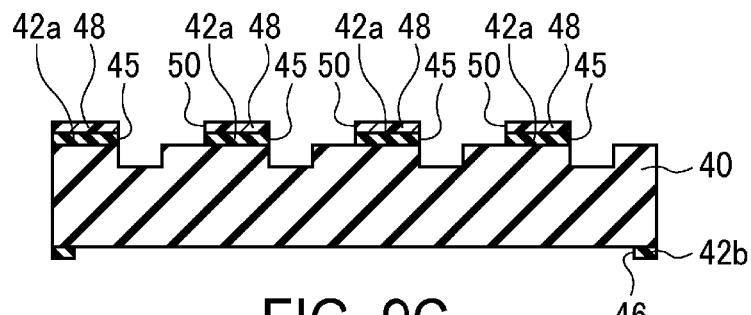

Next, with the photoresist film 48 as the mask, the silicon oxide film 42a is etched by, e.g., dry etching (FIG. 9B).

Figure 9C:
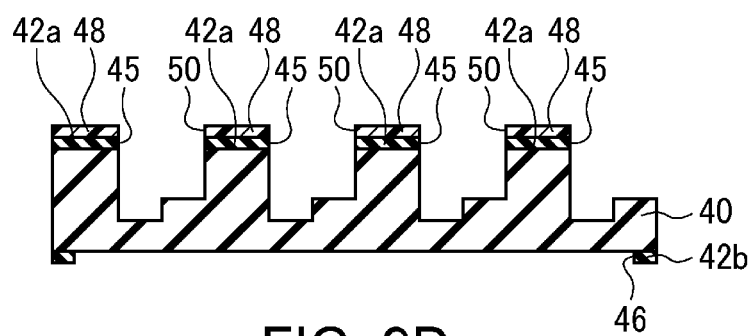

Then, with the photoresist film 48 as the mask, the silicon substrate 40 is etched by, e.g., about 100 μm by, e.g., DRIE method (FIG. 9C). As the conditions of the etching, the same etching conditions as the etching conditions described above with reference to FIG. 9A can be applied.

Next, the photoresist film 48 is removed by, e.g., ashing method, and the silicon oxide film 42a is removed by, e.g., dry etching method.

Then, a support substrate 52 is adhered to the silicon substrate 40. As the support substrate 52, for example, a thermal peeling sheet from Nitto Denko Corporation (trade name: REVALPHA 3195M) may be used. The thickness of the support substrate is, e.g., 525 μm. The support substrate 52 is used for preventing the breakage of the silicon substrate 40 in the below-described process of etching the silicon substrate 40 from the lower surface.

Figure 9D:
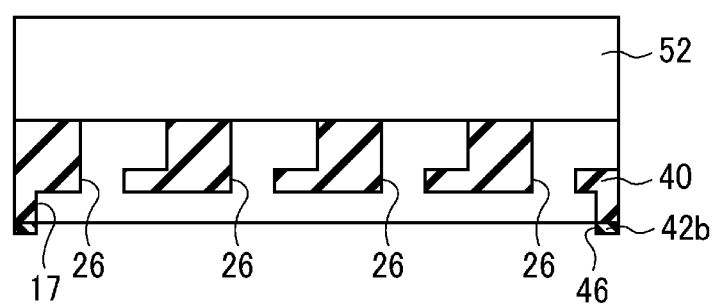

Next, with the silicon oxide film 42b as the mask, the silicon substrate 40 is etched by, e.g., 100 μm from the lower surface thereof by, e.g., DRIE method. Thus, the concavity 17 is formed in the lower surface of the silicon substrate 40. The concavity 17 formed in the lower surface of the silicon substrate 40 and the openings formed in the upper surface of the silicon substrate 40 are connected, forming the through-holes 26 (FIG. 9D). As the etching conditions, the same conditions as the etching conditions described above with reference to FIG. 9A can be applied.

Next, it is assured that the through-holes 26 have been formed in the silicon substrate 40, and then the support substrate 52 is removed.

Figure 9E:
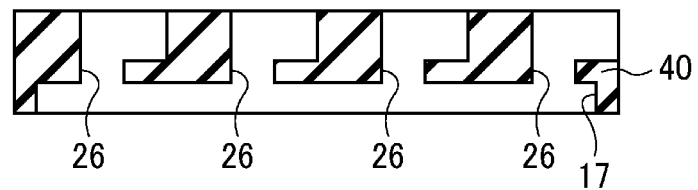

Then, the silicon oxide film 42b is removed by, e.g., dry etching method (FIG. 9E).

Thus, the silicon chips 16a, 16b are manufactured.

The silicon chips 16c, 16d are manufactured as exemplified below.

First, a silicon substrate 54, for example, is prepared as the substrate for the silicon chips 16a, 16b to be formed. The thickness of the silicon substrate 54 is not specifically limited but is about 200 μm-525 μm, e.g., 500 μm. In the present embodiment, patterns, such as a photoresist or others, are formed on the upper surface of the substrate, and etching is made, and for this, as the substrate, the silicon substrate 54 preferably has the upper surface mirror-polished. The silicon substrate 54 may be made conductive by doping an impurity.

Figure 10A:
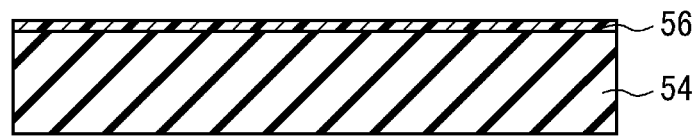

Then, a photoresist film 56 is formed above the silicon substrate 54 by, e.g., spin coating method. The thickness of the photoresist film 56 is, e.g., about 4 μm (FIG. 10A).

Figure 10B:
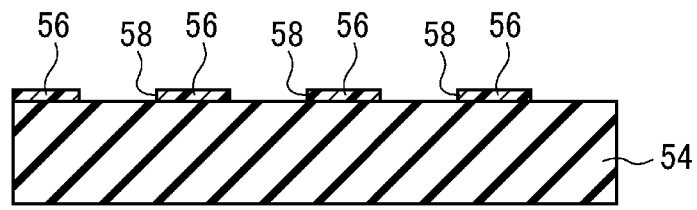

Next, the photoresist film 56 is patterned by photolithography to form openings 58 corresponding to the convexities of the unevenness 27 in the photoresist film (FIG. 10B). The dimensions of the openings 58 are, e.g., about 10200 μm×200 μm.

Figure 10C:
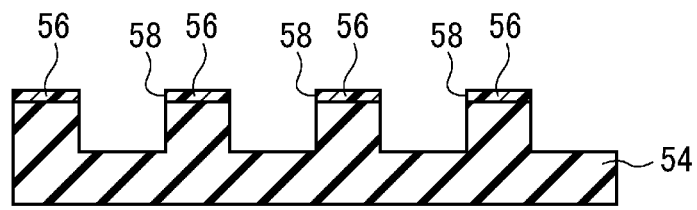

Next, with the photoresist film 56 as the mask, the silicon substrate 56 is etched by, e.g., about 100 μm by, e.g., DRIE method (FIG. 10C). Thus, the concavities of the unevenness 27 are formed in the silicon substrate 56. As the etching conditions, the same conditions as the etching conditions described with reference to FIG. 9A may be used.

Figure 10D:
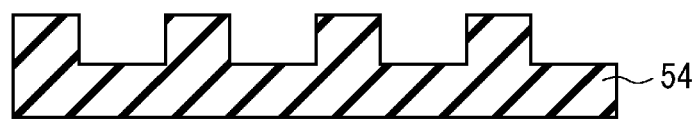

Next, the photoresist film 56 is removed by, e.g., ashing method or others (FIG. 10D).

Thus, the silicon chips 16c, 16d are manufactured.

Then, the layer structure 14 and the silicon chips 16a, 16b, 16c, 16d are jointed.

Figure 11A:
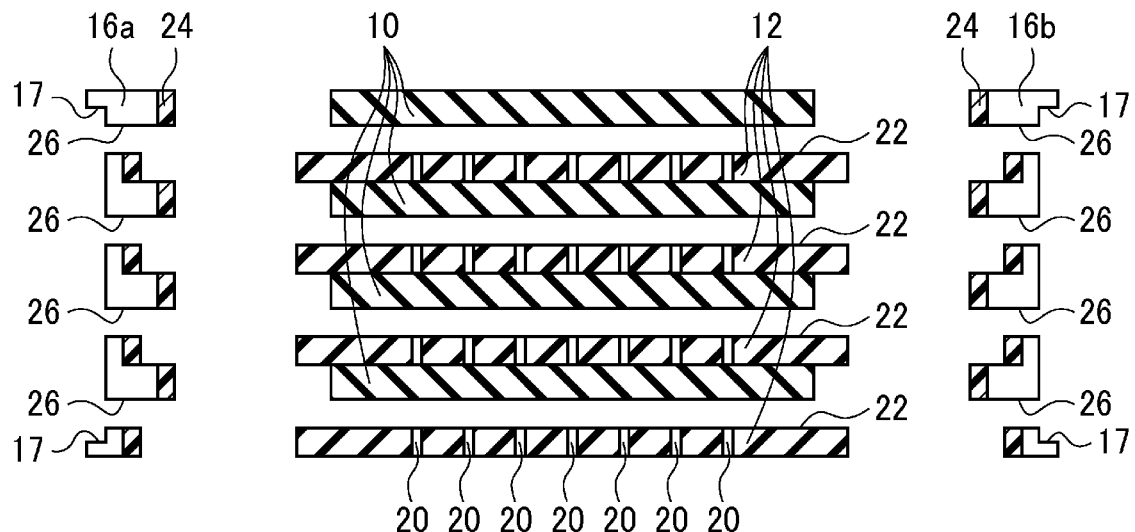

First, PDMS (polydimethylsilioxane) is coated above the surfaces of the silicon chips 16a, 16b to be jointed to the layer structure 14 and dried. Thus, a silicone rubber layers 24 is formed above the surfaces having the unevenness of the silicon chips 16a, 16b (FIG. 11A). The thickness of the silicone rubber layers 24 is, e.g., about 10 μm.

Next, The steps on the side surfaces of the layer structure 14 with the microchannels 22 exposed, and the unevenness 25 on the surfaces of the silicon chips 16a, 16b are aligned to be engaged with each other.

Then, excimer beam is irradiated to the side surfaces of the layer structure 14. The excimer beam is laser beam using a mixed gas of a noble gas, halogen or others. The irradiation of the excimer beam activates the surfaces of the layer structure 14, i.e., the silicon atoms forming the semiconductor chips 10 and the microchannel chips 12.

Figure 11B:
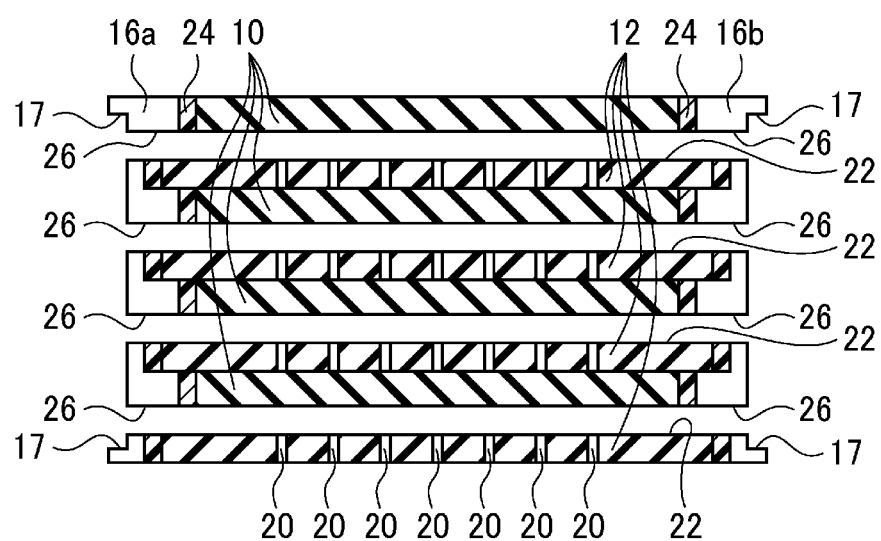

Then, the activated side surfaces of the layer structure 14, and the surfaces of the silicon chips 16a, 16b having the silicone rubber layers 24 formed on are pressure-jointed. Thus, the silicon chips 16a, 16b, and the layer structure 14 are jointed to each other with the silicone rubber layers 24 therebetween (FIG. 11B). The presence of the silicone rubber layers 24 on the joint surfaces also produces the effect of absorbing the impact caused when the silicon chips 16a, 16b, 16c, 16d, and the layer structure 14 are jointed to each other.

At this time, the alignment between the through-holes 26 and the microchannels 22 is made unnecessary by the unevenness 25 and the through-holes 26 are so formed in advance that the positions of the through-holes 26 and the positions of the microchannels 22 are aligned when the unevenness 25 on the surfaces of the microchannel chips 16a, 16b, and the steps on the side surfaces of the layer structure 14 are engaged.

Next, in the same way as in the jointing method described above with reference to FIGS. 11A and 11B, the other side surfaces of the layer structure 14, and the silicon chips 16c, 16d are jointed (not illustrated).

Thus, the three-dimensional mounting semiconductor device according to the present embodiment is manufactured.

As described above, according to the present embodiment, the semiconductor chips 10, the microchannel chips 12 and the silicon chips 16a, 16b, 16c, 16d are formed of silicon. This ensures high reliability against thermal expansion.

According to the present embodiment, the steps are formed on the side surfaces of the layer structure 14, and the unevenness corresponding to the steps formed on the side surfaces of the layer structure 14 is formed on the silicon chips 16a-16d, whereby the layer structure 14 and the silicon chips 16a-16d can be easily jointed.

According to the present embodiment, the concavities 17 formed in the silicon chips 16a, 16b facilitates the joints between the silicon chips 16a, 16b and the pipes 60a, 60b. This can make more flexible the procedure of the process of mounting the three-dimensional mounting semiconductor device on other substrates. More specifically, the three-dimensional mounting semiconductor device may be mounted on other substrates after the silicon chips 16a, 16b and the pipes 60a, 60b have been jointed to each other. Otherwise, after the three-dimensional mounting semiconductor device has been mounted on other substrate, the silicon chips 16a, 16b and the pipes 60a, 60b may be jointed to each other.

[A Second Embodiment]

A three-dimensional mounting semiconductor device and a method of manufacturing the same according to a second embodiment will be described with reference to FIGS. 12 to 16C. The same members of the present embodiment as those of the three-dimensional mounting semiconductor device according to the first embodiment illustrated in FIGS. 1 to 11B are represented by the same reference numbers not to repeat or to simplify the description.

Figure 12:
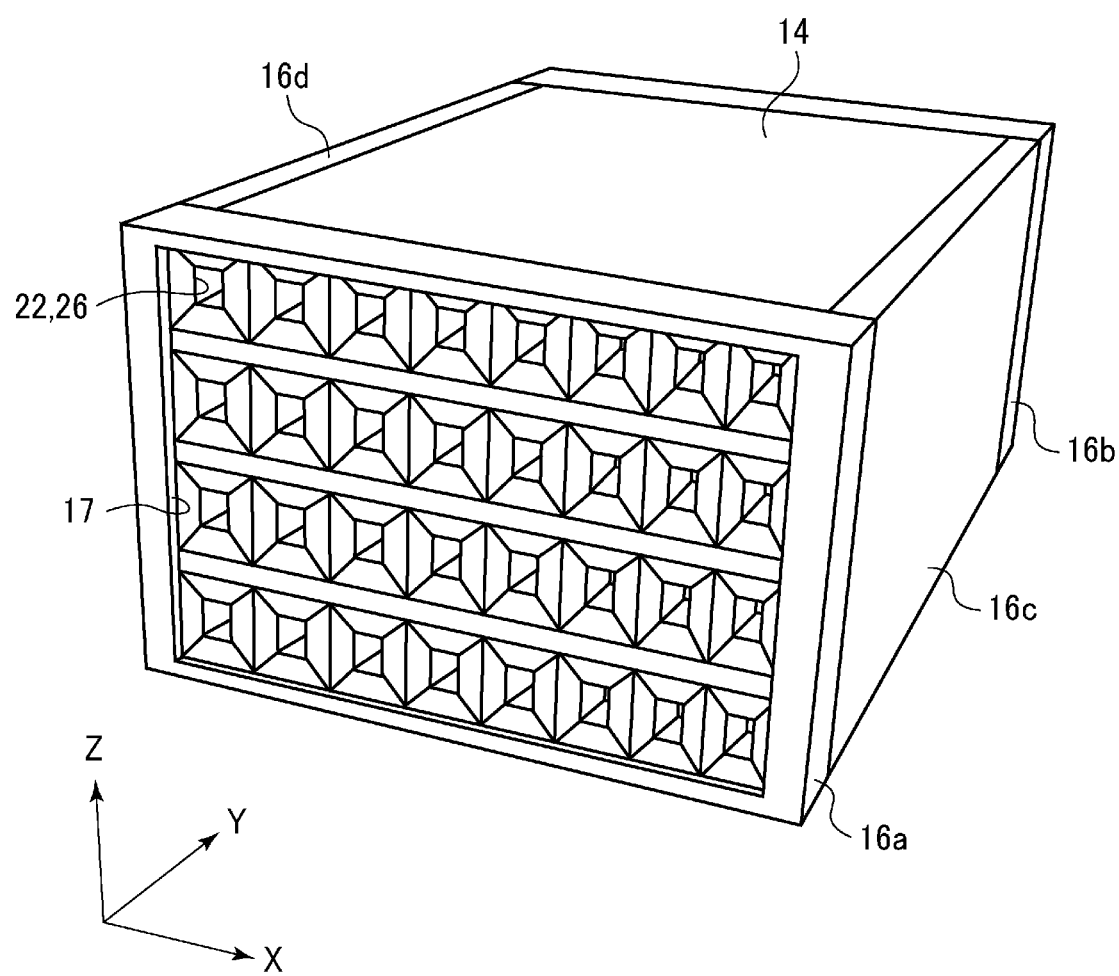
FIG. 12 is a perspective view illustrating a structure of a three-dimensional mounting semiconductor device according to a second embodiment.
Figure 13:
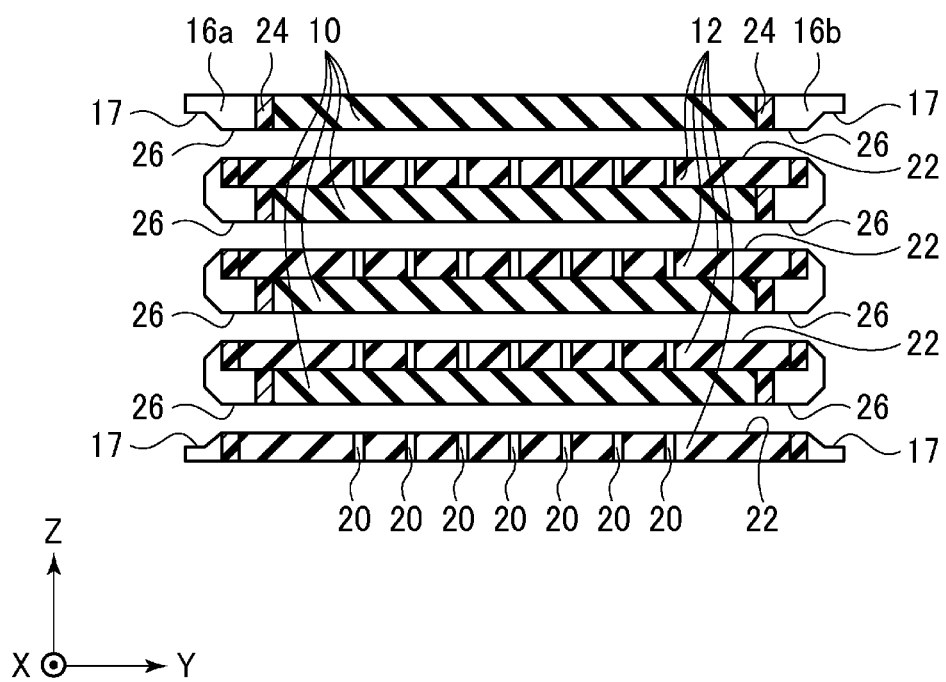
FIG. 13 is a cross-sectional view illustrating the structure of the three-dimensional mounting semiconductor device according to the second embodiment.
Figure 14:
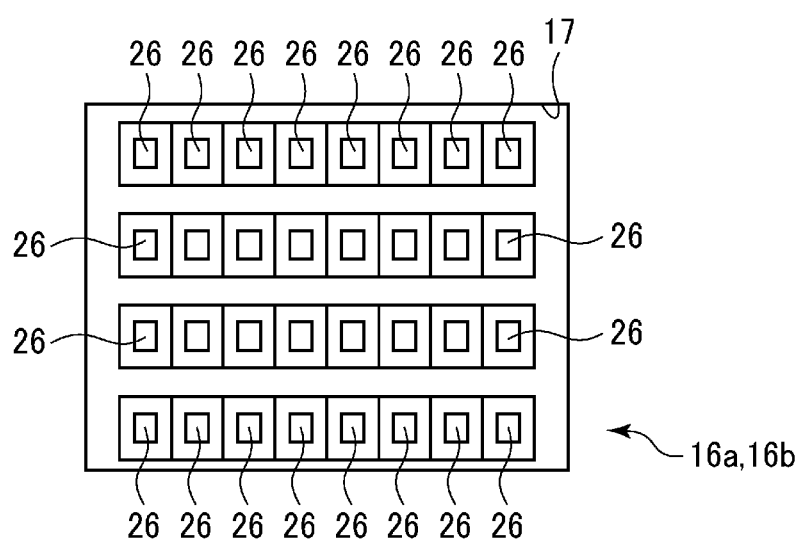
FIG. 14 is a plan view illustrating a structure of silicon chips used in the three-dimensional mounting semiconductor device according to the second embodiment.

FIG. 12 is a perspective view illustrating a structure of the three-dimensional mounting semiconductor device according to the present embodiment. FIG. 13 is a cross-sectional view illustrating the structure of the three-dimensional mounting semiconductor device according to the present embodiment. FIG. 14 is a plan view illustrating a structure of silicon chips used in the three-dimensional mounting semiconductor device according to the present embodiment. FIGS. 15A-16C are cross-sectional views illustrating the method of manufacturing the three-dimensional mounting semiconductor device according to the present embodiment.

First, the structure of the three-dimensional mounting semiconductor device according to the present embodiment will be described with reference to FIGS. 12 to 14. FIG. 13 is the cross-sectional view parallel to the Y-Z plane of FIG. 12.

The three-dimensional mounting semiconductor device according to the present embodiment is the same as the three-dimensional mounting semiconductor device according to the first embodiment illustrated in FIG. 1 except that the through-holes 26 formed in the silicon chips 16a, 16b are different in the configuration.

That is, in the three-dimensional mounting semiconductor device according to the present embodiment, as illustrated in FIGS. 12 to 14, the through-holes formed in the chips 16a, 16b are tapered with the width (inner diameter) reduced toward the microchannels 22.

The configuration of the through-holes 26 are such tapered, whereby the resistance of the cooling fluid flowing into the microchannels 22 from the pipe 60a through the through-holes 26, and the resistance of the cooling fluid flowing out of the microchannels 22 into the pipe 60b through the through-holes 26 can be decreased. That is, the pressure loss due to the frictional resistance between the cooling fluid and the through-holes 26 can be decreased. Thus, the cooling efficiency of the semiconductor device can be improved.

Next, the method of manufacturing the three-dimensional mounting semiconductor device according to the present embodiment will be described with reference to FIGS. 15A to 16C.

The method of manufacturing the three-dimensional mounting semiconductor device according to the present embodiment is the same as the method of manufacturing the three-dimensional mounting semiconductor device according to the first embodiment except that the manufacturing method of the silicon chips 16a, 16b is different.

The silicon chips 16a, 16b of the three-dimensional mounting semiconductor device according to the present embodiment can be manufactured as exemplified below.

First, as the substrate for the silicon chips 16a, 16b to be formed, the silicon substrate 70, for example, is prepared. The thickness of the silicon substrate 70 is not specifically limited but is 200 μm-525 μm, e.g., 500 μm. In the present embodiment, patterns, such as photoresists or others, are formed on both surfaces of the substrate, and etching is made, and for this, as the substrate, preferably, the silicon substrate has both surfaces mirror-polished. The silicon substrate 70 may be made conductive by doping an impurity.

Next, above the upper surface and the lower surface of the silicon substrate 70, silicon oxide films 72a, 72b are formed by, e.g., plasma CVD method. The film thickness of the silicon oxide films 72a, 72b is, e.g., about 1 μm-2 μm.

Next, the silicon oxide films 72a, 72b are patterned by photolithography and dry etching. Thus, an opening 46 is formed in the region of the silicon oxide film 72a for the concavity 17 to be formed in. The opening dimensions of the opening 46 is, e.g., 10000 μm×2000 μm.

Figure 15A:
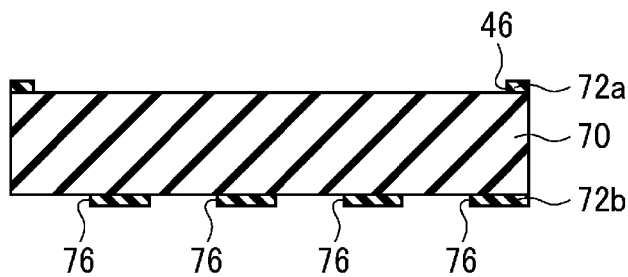
FIGS. 15A-15F and 16A-16C are cross-sectional views illustrating a method of manufacturing the three-dimensional mounting semiconductor device according to the second embodiment.

Next, the silicon oxide film 72b is patterned by photolithography and dry etching. Thus, in the silicon oxide film 72b, openings 76 corresponding to the convexities of the unevenness 25 are formed. The opening dimensions of the openings 76 is, e.g., 10200 μm×200 μm (FIG. 15A).

Then, a photoresist film 78 is formed above the surface of the silicon substrate 70 by, e.g., spin coating method. The film thickness of the photoresist film 78 is, e.g., about 4 μm.

Figure 15B:
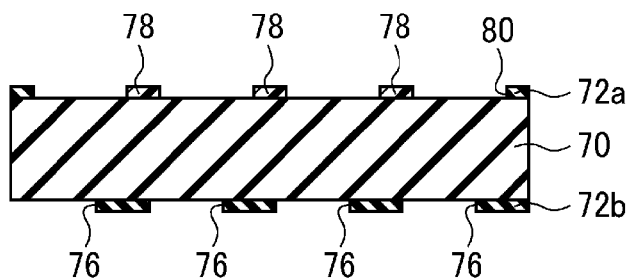
Figure 15C:
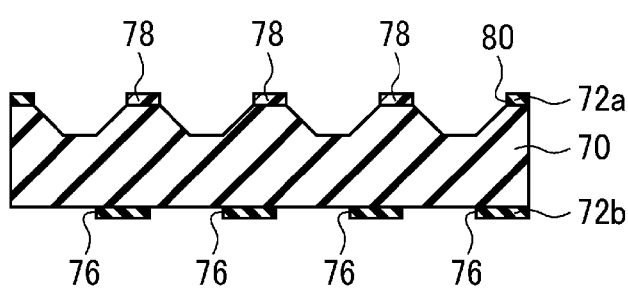

Then, the photoresist film 78 is patterned by photolithography. Thus, in the photoresist film 78, openings 80 corresponding to the opened surfaces of the tapered through-holes 26 are formed (FIG. 15B). The opening dimensions of the openings 80 are, e.g., about 10000 μm×2000 μm Then, by, e.g., DRIE method with the silicon oxide film 72a and the photoresist film 78 as the mask, the silicon substrate 70 is so etched that the side surfaces are tapered (FIG. 15C). More specifically, in the first step of the DRIE method, the processing can be made for 6.3 seconds by introducing $C_4F_8$ gas at the flow rate of 130 sccm under the conditions of the coil power of 600 W and the internal pressure of the process chamber of 14.5 mTorr. As the second step of the DRIE method, the processing can be made for 4.5 seconds at the flow rate of $SF_6$ gas of 130 sccm under the conditions of the coil power of 600 W, the internal pressure of the process chamber of 14.5 mTorr and the RF power to the substrate of 23 W of 380 kHz. The first step and the second step are alternately repeated. Thus, the lateral etching can be controlled. That is, the etching can be made while the side wall configurations are being controlled. The silicon substrate 70 may be etched by anisotropic wet etching.

Next, the photoresist film 78 is removed by, e.g., ashing method or others.

Figure 15D:
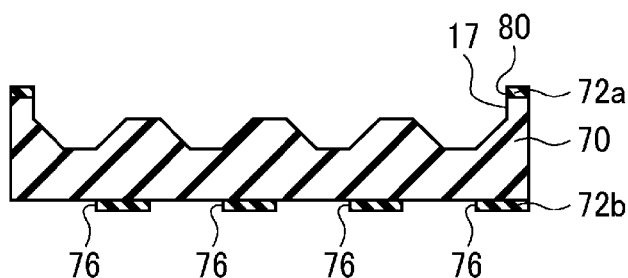

Next, with the silicon oxide film 72a as the mask, the silicon substrate 70 is etched by, e.g., about 100 μm by, e.g., DRIE method. Thus, the concavity 17 is formed in the silicon substrate 70 (FIG. 15D). As the etching conditions, the same conditions as the etching conditions described above with reference to FIG. 9A can be applied.

Figure 15E:
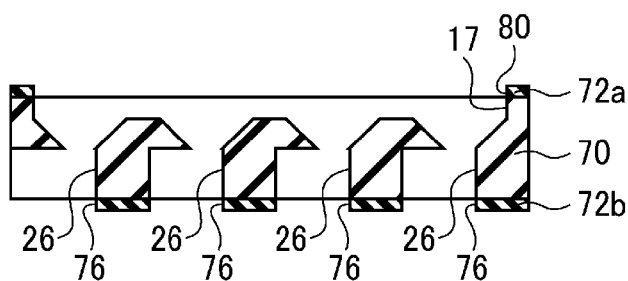

Then, with the silicon oxide film 72b as the mask the silicon substrate 70 is etched from the lower surface thereof by, e.g., about 100 μm by, e.g., DRIE method. Thus, the unevenness 25 are formed on the lower surface of the silicon substrate 70. The unevenness 25 formed on the lower surface of the silicon substrate 70 and the openings formed in the upper surface of the silicon substrate 70 are connected, and the tapered through-holes 26 are formed (FIG. 15E). As the etching conditions, the same conditions as the etching condition described above with reference to FIG. 9A can be applied.

Figure 15F:
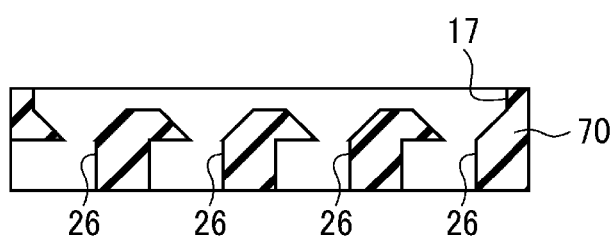

Then, the silicon oxide films 72a, 72b are removed by, e.g., dry etching method (FIG. 15F).

Thus, the silicon chips 16a, 16b of the three-dimensional mounting semiconductor device according to the present embodiment are manufactured.

Figure 16A:
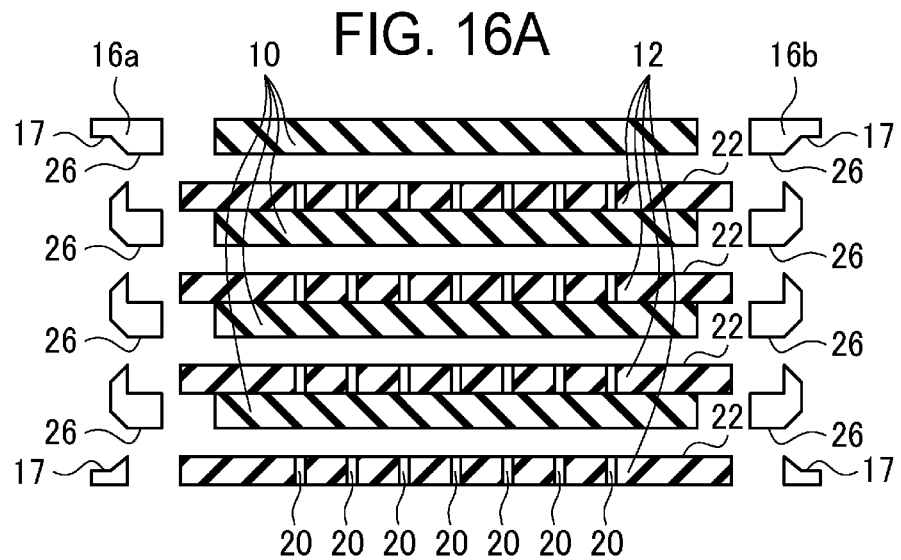
Figure 16B:
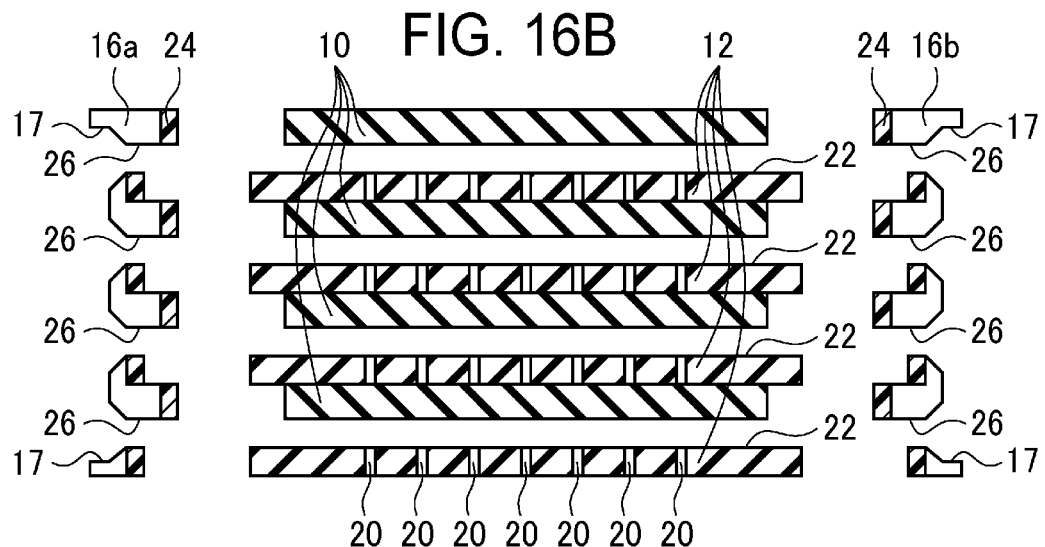
Figure 16C:
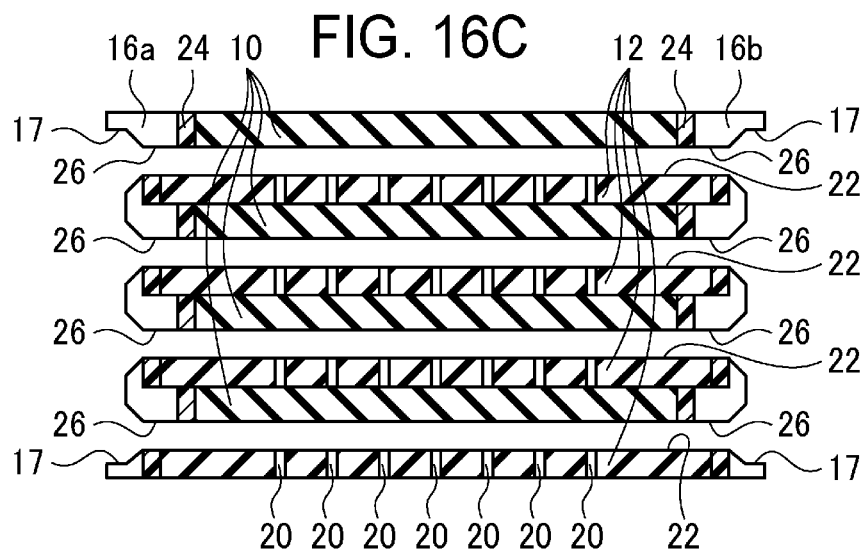

The thus-manufactured silicon chips 16a, 16b are jointed to the side surfaces of the layer structure 14 separately manufactured in the same procedure as in the method of manufacturing the three-dimensional mounting semiconductor device according to the first embodiment (FIGS. 16A-16C).

Then, the silicon chips 16c, 16d are jointed to the layer structure 14, and the three-dimensional mounting semiconductor device according to the present embodiment is completed.

As described above, according to the present embodiment, the through-holes 26 of the silicon chips 16a, 16b are tapered, whereby the pressure loss due to the frictional resistance between the cooling fluid and the through-holes 26 can be reduced. Thus, the cooling efficiency can be improved.

[A Third Embodiment]

A three-dimensional mounting semiconductor device and the method of manufacturing the same according to a third embodiment will be described with reference to FIGS. 17 to 18B. The same members of the present embodiment as those of the three-dimensional mounting semiconductor device according to the first and the second embodiments illustrated in FIGS. 1 to 16C are represented by the same reference numbers not to repeat or to simplify the description.

Figure 17:
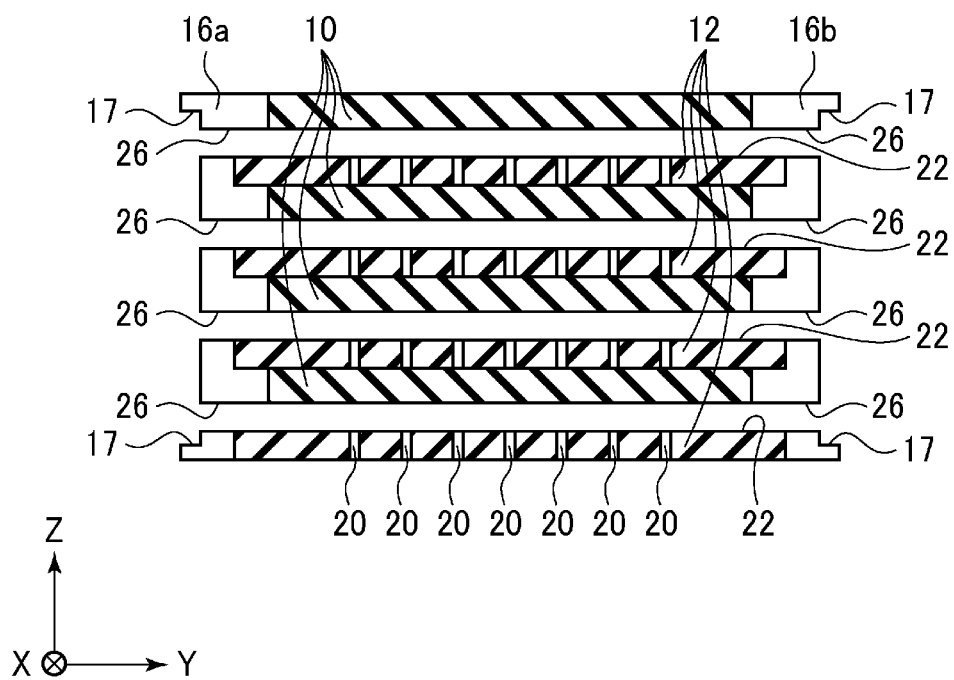
FIG. 17 is a cross-sectional view illustrating a structure of a three-dimensional mounting semiconductor device according to a third embodiment.
Figure 18A:
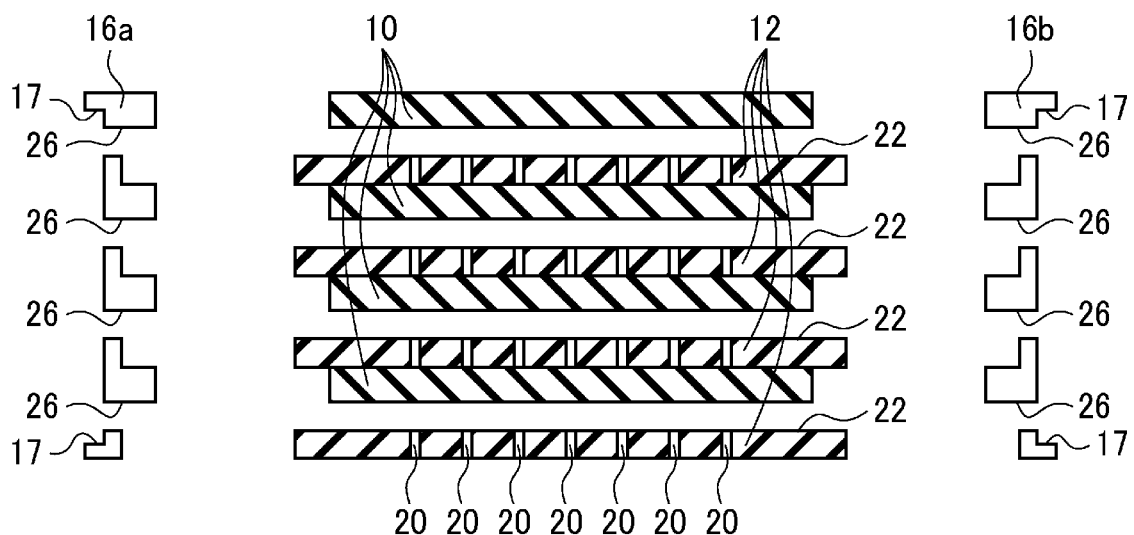
FIGS. 18A-18B are cross-sectional views illustrating a method of manufacturing the three-dimensional mounting semiconductor device according to the third embodiment.
Figure 18B:
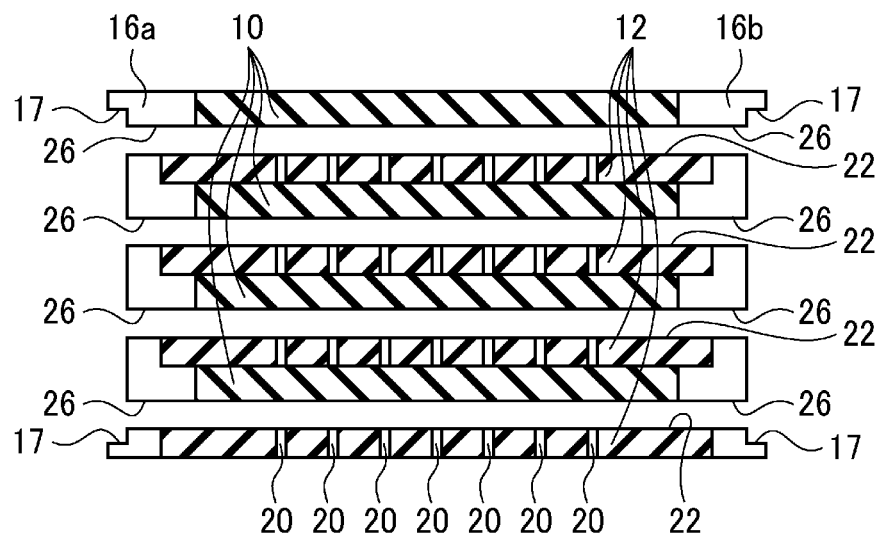

FIG. 17 is a cross-sectional view illustrating a structure of the three-dimensional mounting semiconductor device according to the present embodiment. FIGS. 18A-18B are cross-sectional views illustrating the method of manufacturing the three-dimensional mounting semiconductor device according to the present embodiment.

First, the structure of the three-dimensional mounting semiconductor device according to the present embodiment will be described with reference to FIG. 17. FIG. 17 is the cross-sectional view parallel to the Y-Z plane of FIG. 1.

As illustrated in FIG. 17, the three-dimensional mounting semiconductor device according to the present embodiment is basically the same in the structure as the three-dimensional mounting semiconductor device according to the first embodiment. The three-dimensional mounting semiconductor device according to the present embodiment is different from the three-dimensional mounting semiconductor device according to the first embodiment in that in the former, the silicon chips 16a, 16b, 16c, 16d are jointed directly to the layer structure 14 without the silicone rubber layer 24 therebetween (refer to FIG. 17).

Next, the method of manufacturing the three-dimensional mounting semiconductor device according to the present embodiment will be described with reference to FIGS. 18A and 18B.

First, the layer structure 14 and the silicon chips 16a, 16b, 16c, 16d are prepared by the same procedure of the method of manufacturing the three-dimensional mounting semiconductor device according to the first embodiment.

Next, the silicon chips 16a, 16b, 16c, 16d are joined to the side surfaces of the layer structure 14.

The alignment is so made that the steps on the side surfaces of the layer structure 14, where the microchannels 22 are exposed, and the unevenness 25 on the surfaces of the silicon chips 16a, 16b are aligned to be engaged with each other (FIG. 18A).

Next, for example, ion beam of a raw material gas of, e.g., argon gas are irradiated to the side surfaces of the layer structure 14 and the surfaces with the unevenness 25 of the silicon chips 16a, 16b. The irradiation of the ion beam activates the side surfaces of the layer structure 14 and the surfaces of the silicon chips 16a, 16b.

In place of the irradiation of argon ions, it is possible to apply plasmas of, e.g., oxygen and then make nitrogen radial processing.

Then, the activated side surfaces of the layer structure 14, and the activated surfaces of the silicon chips 16a, 16b are pressure-jointed. Thus, the activated silicon atoms of the surfaces of the layer structure 14, and the activated silicon atoms of the surfaces of the silicon chips 16a, 16b are combined. That is, the silicon chips 16a, 16b, and the layer structure 14 are jointed (FIG. 18B).

In the present embodiment, the surfaces of the layer structure 14 and the surfaces of the silicon chips 16a, 16b are activated to thereby joint directly the layer structure 14, and the silicon chips 16a, 16b, but the jointing method is not essentially limited to this.

For example, the layer structure 14 and the silicon chips 16a, 16b may be jointed by the metal jointing method. In the case that the metal jointing method is used, a metal thin film of, e.g., about 10 nm-100 nm is formed above the surfaces with the unevenness 25 of the silicon chips 16a, 16b. As the material forming the metal thin film, copper or aluminum, for example, is used. Then, the layer structure 14, and the silicon chips 16a, 16b are brought into contact and subjected to heat process of, e.g., 400° C. for, e.g., 1 hour. Thus, the layer structure 14, and the silicon chips 16a, 16b are jointed to each other.

Next, by the same method as the jointing method described above with reference to FIGS. 18A, 18B, the other side surfaces of the layer structure 14, and the silicon chips 16c, 16d are jointed to each other (not illustrated).

Thus, the three-dimensional mounting semiconductor device according to the present embodiment is manufactured.

As described above, according to the present embodiment, the surfaces of the layer structure 14 and the surfaces with the unevenness 25 of the silicon chips 16a, 16b are activated to thereby be jointed at the room temperature.

[Modified Embodiments]

The above-described embodiments can cover other various modifications.

For example, in the first embodiment and the second embodiment, the layer structure 14 and the silicon chips 16a, 16b are jointed with the silicone rubber layers 24 therebetween, but the jointing method is not specifically limited. For example, in place of the silicone rubber layers 24, a silicone-based adhesive or polyimide layers may be used. As the silicone-based adhesive, the silicone resin from Dow Corning Toray Co., Ltd. (trade name: SYLGARD (registered trademark) series), for example, can be used. As the material forming the polyimide layer, the polyimide resin from Hitachi DuPont MicroSystems, LLC (trade name: HD3000 series), for example, may be used.

In the above-described embodiments, the X-directional size and the Y-direction size of the semiconductor chips 10, and the X-directional size and the Y-directional size of the microchannel chips 12 are different, but this is not essential. For example, the X-directional size and the Y-directional size of the semiconductor chips 10, and the X-directional size and the Y-directional size of the microchannel chips 12 may be the same. In this case, the semiconductor chips 10 and the microchannel chips 12 are stacked, forming the steps on the respective side surfaces.

In the above-described embodiment, as the method for etching the silicon chips 16a-16d, DRIE method is used, but this is not essential. For example, wet etching may be used.

In the second embodiment, the layer structure 14 and the silicon chips 16a, 16b, 16c, 16d are jointed with the silicone rubber layers 24 therebetween, but this is not essential. For example, as in the third embodiment, the layer structure 14 and the silicon chips 16a, 16b, 16c, 16d may be directly jointed and otherwise may be jointed by other methods, such as metal jointing method, etc.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A three-dimensional mounting semiconductor device comprising:
    a layer structure including a plurality of first substrates with a trench-shaped concavity formed in and a plurality of second substrates with semiconductor elements formed in, which are alternately stacked,
        wherein an unevenness defined by a size difference between the first substrate and the second substrate is formed on a side surface of the layer structure, and
        a first through-hole is defined by an inside surface of the trench-shaped concavity and a surface of the second substrate; and
    a third substrate jointed to the side surface of the layer structure and having an unevenness formed on a surface jointed to the layer structure which is engaged with the unevenness formed on the side surface of the layer structure, the third substrate covering the whole area of the side surface of the layer structure, wherein
    the first substrate, the second substrate and the third substrates are formed of materials of the same thermal expansion coefficient.

2. The three-dimensional mounting semiconductor device according to claim 1, wherein
    the material forming the first substrate, the second substrate and the third substrate is silicon.

3. The three-dimensional mounting semiconductor device according to claim 1, wherein
    the third substrate is jointed to the respective side surfaces of the layer structure.

4. The three-dimensional mounting semiconductor device according to claim 1, wherein
    the third substrate has a second through-hole opposed to the first through-hole.

5. The three-dimensional mounting semiconductor device according to claim 4, wherein
    the second through-hole has a tapered configuration whose width decreases toward the first through-hole.

6. The three-dimensional mounting semiconductor device according to claim 4, wherein
    a size of the second through-hole on a side of the layer structure is substantially equal to a size of the first through-hole.

7. The three-dimensional mounting semiconductor device according to claim 4, wherein the third substrate has a concavity formed in a surface opposite to the surface joined to the layer structure, in which a pipe for a fluid introduced in or discharged from the first through-hole is to be connected.

8. The three-dimensional mounting semiconductor device according to claim 1, wherein
the first through-hole is a microchannel.

9. The three-dimensional mounting semiconductor device according to claim 1, wherein
the third substrate has non-conductivity.

10. A method of manufacturing a three-dimensional mounting semiconductor device comprising:
alternately stacking a plurality of first substrates with a trench-shaped concavity formed in and a plurality of second substrates with semiconductor elements formed in to form a layer structure having a first through-hole defined by an inside surface of the trench-shaped concavity and a surface of the second substrate and an unevenness defined by a size difference between the first substrate and the second substrate formed on a side surface of the layer structure; and
jointing a third substrate having an unevenness which is engaged with the unevenness formed on the side surface of the layer structure, to the side surface of the layer structure, the third substrate covering the whole area of the side surface of the layer structure, wherein
the first substrate, the second substrate, and the third substrates are formed of materials of the same thermal expansion coefficient.

11. The method of manufacturing a three-dimensional mounting semiconductor device according to claim 10, wherein
the third substrate is jointed to the respective side surfaces of the layer structure.

12. The method of manufacturing a three-dimensional mounting semiconductor device according to claim 10, wherein
the third substrate is jointed to the layer structure with a silicone rubber layer provided therebetween.

13. The method of manufacturing a three-dimensional mounting semiconductor device according to claim 10, wherein
the third substrate is jointed directly to the layer structure.

14. The method of manufacturing a three-dimensional mounting semiconductor device according to claim 10, wherein
the third substrate has non-conductivity.

* * * * *